(12) United States Patent
Chang Chien et al.

(10) Patent No.: US 11,367,678 B2
(45) Date of Patent: Jun. 21, 2022

(54) PACKAGE STRUCTURE AND MANUFACTURING METHOD THEREOF

(71) Applicant: Powertech Technology Inc., Hsinchu County (TW)

(72) Inventors: Shang-Yu Chang Chien, Hsinchu County (TW); Hung-Hsin Hsu, Hsinchu County (TW); Chia-Yu Hung, Hsinchu County (TW); Nan-Chun Lin, Hsinchu County (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 16/953,362

(22) Filed: Nov. 20, 2020

(65) Prior Publication Data
US 2021/0202364 A1 Jul. 1, 2021

Related U.S. Application Data

(60) Provisional application No. 62/955,456, filed on Dec. 31, 2019.

(51) Int. Cl.
*H01L 23/00* (2006.01)
*H01L 23/498* (2006.01)
(Continued)

(52) U.S. Cl.
CPC ...... *H01L 23/49838* (2013.01); *H01L 21/481* (2013.01); *H01L 21/4853* (2013.01);
(Continued)

(58) Field of Classification Search
CPC ............. H01L 23/49838; H01L 21/481; H01L 21/4853; H01L 21/4857; H01L 21/56;
(Continued)

(56) References Cited

U.S. PATENT DOCUMENTS

2018/0204822 A1* 7/2018 Lin ................. H01L 21/561
2019/0386051 A1 12/2019 Hong et al.
2019/0393195 A1 12/2019 Lee et al.

FOREIGN PATENT DOCUMENTS

CN 108431946 8/2018
TW 201440182 10/2014
(Continued)

OTHER PUBLICATIONS

"Office Action of Taiwan Counterpart Application", dated Jan. 6, 2021, p. 1-p. 9.
(Continued)

*Primary Examiner* — Elias Ullah
(74) *Attorney, Agent, or Firm* — JCIPRNET

(57) ABSTRACT

A package structure including a first circuit board, a second circuit board, an encapsulant, a plurality of conductive terminals, and a package device is provided. The first circuit board has a first top surface and a first bottom surface opposite to each other. The second circuit board has a second top surface and a second bottom surface opposite to each other. The encapsulant encapsulates the first and second circuit boards. The conductive terminals are disposed on the first or second bottom surface and electrically connected to the first or second circuit board. The package device is disposed on the first or second top surface and electrically connected to the first and second circuit boards. The package device includes a first chip, a second chip, a chip encapsulant, a circuit layer, and a plurality of conductive package terminals. A manufacturing method of a package structure is also provided.

16 Claims, 14 Drawing Sheets

(51) Int. Cl.
*H01L 25/18* (2006.01)
*H01L 21/56* (2006.01)
*H01L 21/683* (2006.01)
*H01L 25/065* (2006.01)
*H01L 25/16* (2006.01)
*H01L 25/00* (2006.01)
*H01L 23/31* (2006.01)
*H01L 23/538* (2006.01)
*H01L 21/48* (2006.01)
*H01L 23/24* (2006.01)
*H01L 21/78* (2006.01)
*H01L 23/16* (2006.01)
*H01L 23/367* (2006.01)
*H01L 23/552* (2006.01)

(52) U.S. Cl.
CPC .......... *H01L 21/4857* (2013.01); *H01L 21/56* (2013.01); *H01L 21/565* (2013.01); *H01L 21/568* (2013.01); *H01L 21/6835* (2013.01); *H01L 21/78* (2013.01); *H01L 23/16* (2013.01); *H01L 23/24* (2013.01); *H01L 23/31* (2013.01); *H01L 23/3128* (2013.01); *H01L 23/3675* (2013.01); *H01L 23/49811* (2013.01); *H01L 23/49816* (2013.01); *H01L 23/49822* (2013.01); *H01L 23/49833* (2013.01); *H01L 23/5385* (2013.01); *H01L 23/5386* (2013.01); *H01L 23/562* (2013.01); *H01L 24/05* (2013.01); *H01L 24/13* (2013.01); *H01L 24/14* (2013.01); *H01L 24/16* (2013.01); *H01L 24/17* (2013.01); *H01L 25/0652* (2013.01); *H01L 25/0655* (2013.01); *H01L 25/16* (2013.01); *H01L 25/18* (2013.01); *H01L 25/50* (2013.01); *H01L 21/561* (2013.01); *H01L 23/552* (2013.01); *H01L 2221/68359* (2013.01); *H01L 2224/02311* (2013.01); *H01L 2224/02313* (2013.01); *H01L 2224/02379* (2013.01); *H01L 2224/02381* (2013.01); *H01L 2224/13024* (2013.01); *H01L 2224/16145* (2013.01); *H01L 2224/16227* (2013.01); *H01L 2224/1716* (2013.01)

(58) Field of Classification Search
CPC . H01L 21/565; H01L 21/568; H01L 21/6835; H01L 21/78; H01L 23/16; H01L 23/24; H01L 23/31; H01L 23/3128; H01L 23/3675; H01L 23/49811; H01L 23/49816; H01L 23/49822; H01L 23/49833; H01L 23/5385; H01L 23/5386; H01L 23/562; H01L 24/05; H01L 24/13; H01L 24/14; H01L 24/16; H01L 24/17; H01L 25/0652; H01L 25/0655; H01L 25/16; H01L 25/18; H01L 25/50; H01L 21/561; H01L 23/552; H01L 2221/68359; H01L 2224/02311; H01L 2224/02313; H01L 2224/02379; H01L 2224/02381; H01L 2224/13024; H01L 2224/16145; H01L 2224/16227; H01L 2224/1716; H01L 24/20; H01L 24/32; H01L 24/73; H01L 24/92; H01L 2224/0401; H01L 2224/05572; H01L 2224/11334; H01L 2224/11462; H01L 2224/11849; H01L 2224/13083; H01L 24/19; H01L 24/96; H01L 24/97; H01L 2221/68345; H01L 2221/68372; H01L 2224/04105; H01L 2224/12105; H01L 2224/214; H01L 2224/32145; H01L 2224/32225; H01L 2224/73204; H01L 2224/92125; H01L 2224/97; H01L 2924/18162; H01L 23/5389; H01L 23/4824; H01L 24/03; H01L 2224/0231; H01L 22/32; H01L 2224/02331
See application file for complete search history.

(56) References Cited

FOREIGN PATENT DOCUMENTS

| | | |
|---|---|---|
| TW | 201603235 | 1/2016 |
| TW | 201639110 | 11/2016 |
| TW | 201715661 | 5/2017 |

OTHER PUBLICATIONS

Office Action of Taiwan Counterpart Application, dated Jan. 5, 2022, pp. 1-10.

* cited by examiner

PACKAGE STRUCTURE AND MANUFACTURING METHOD THEREOF

CROSS-REFERENCE TO RELATED APPLICATION

This application claims the priority benefit of U.S. provisional application Ser. No. 62/955,456, filed on Dec. 31, 2019. The entirety of the above-mentioned patent application is hereby incorporated by reference and made a part of this specification.

BACKGROUND

Technical Field

The disclosure relates to a package structure and a manufacturing method thereof, and particularly to a package structure having a plurality of chips and a plurality of circuit boards and a manufacturing method of the package structure.

Description of Related Art

In recent years, electronic devices have played a more and more important role in human lives. In order to accelerate the integration of various functions, a plurality of active chips may be integrated in a package structure. Therefore, how to improve the manufacturing yield or quality of a package structure with the active chips or how to reduce the manufacturing cost of the package structure with the active chips has become an imminent issue to be solved.

SUMMARY

The disclosure provides a package structure with improved quality.

The disclosure provides a manufacturing method of a package structure, whereby a good manufacturing yield may be achieved at relatively low costs.

In an embodiment of the disclosure, a package structure includes a first circuit board, a second circuit board, a first encapsulant, a plurality of conductive terminals, and a package device. The first circuit board has a first top surface and a first bottom surface opposite to the first top surface. The second circuit board has a second top surface and a second bottom surface opposite to the second top surface. The first encapsulant encapsulates the first circuit board and the second circuit board. The conductive terminals are disposed on the first bottom surface or the second bottom surface and electrically connected to the first circuit board or the second circuit board. The package device is disposed on the first top surface or the second top surface and electrically connected to the first circuit board and the second circuit board. The package device includes a first chip, a second chip, a chip encapsulant, a circuit layer, and a plurality of conductive package terminals. The chip encapsulant encapsulates the first chip and the second chip. The circuit layer is located on the chip encapsulant and electrically connected to the first chip and the second chip. The conductive package terminals are located on the circuit layer and electrically connected to the first circuit board or the second circuit board.

In an embodiment of the disclosure, a manufacturing method of a package structure includes following steps: providing a first circuit board having a first top surface and a first bottom surface opposite to the first top surface; providing a second circuit board having a second top surface and a second bottom surface opposite to the second top surface; forming a first encapsulant encapsulating the first circuit board and the second circuit board; disposing a package device on the first top surface or the second top surface, wherein the package device is electrically connected to the first circuit board and the second circuit board and includes a first chip, a second chip, a chip encapsulant, a circuit layer, and a plurality of conductive package terminals, the chip encapsulant encapsulates the first chip and the second chip, the circuit layer is located on the chip encapsulant and electrically connected to the first chip and the second chip, and the conductive package terminals are located on the circuit layer and electrically connected to the first circuit board or the second circuit board; forming a plurality of conductive terminals on the first bottom surface or the second bottom surface, wherein the conductive terminals are electrically connected to the first circuit board or the second circuit board.

In light of the foregoing, in the package structure with a plurality of chips, a plurality of circuit boards may be electrically connected to the chips, so that the manufacturing method of the package structure may be relatively simple, and/or the manufacturing costs may be relatively low. In addition, the overall circuit layout of the package structure may reduce the load of the circuit layer connected between the chips to improve the quality of the package structure.

Several exemplary embodiments accompanied with figures are described in detail below to further describe the disclosure in details.

BRIEF DESCRIPTION OF THE DRAWINGS

Reference will now be made in detail to the embodiments of the disclosure, examples of which are illustrated in the accompanying drawings. Wherever possible, the same reference numbers are used in the drawings and the description to refer to the same or like parts.

DETAILED DESCRIPTION OF DISCLOSED EMBODIMENTS

Figure 1A:
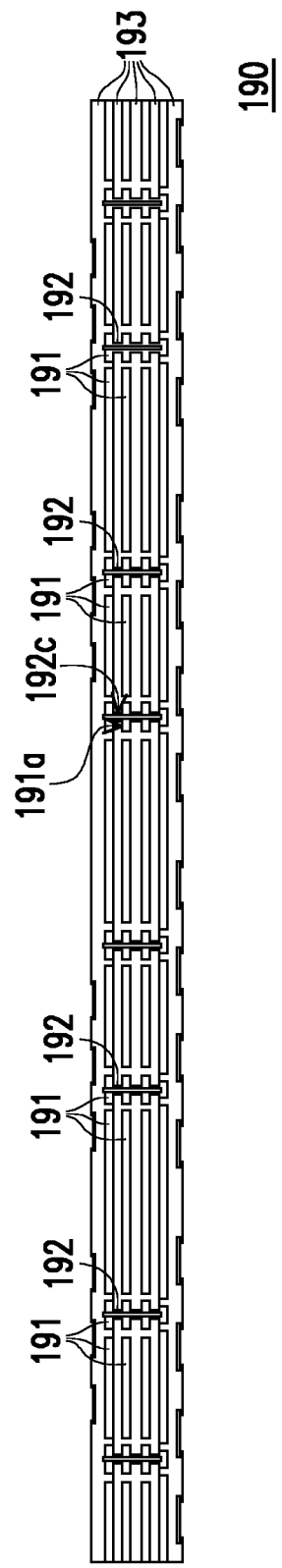
FIG. 1A to FIG. 1I are schematic partial cross-sectional views of some steps of a manufacturing method of a package structure according to a first embodiment of the disclosure.

The directional terms used herein (for instance, "up," "down," "right," "left," "front," "back," "top," and "bottom") are only for referencing to the drawings and are not intended to imply absolute orientation. In addition, for purposes of clarity, some of the film layers or components shown in the drawings may be omitted.

Unless otherwise expressly stated, steps of any method described herein are by no means intended to be construed as requiring execution in a particular order.

The disclosure is more comprehensively elaborated with reference to the drawings of the embodiments. However, the invention disclosed herein may also be embodied in a variety of different forms and should not be limited to the embodiments described herein. The thickness, dimensions, or size of layers or regions in the drawings are enlarged for clarity. The same or similar reference numbers denote the same or similar elements, which will not be reiterated one by one in the following paragraphs.

FIG. 1A to FIG. 1I are schematic partial cross-sectional views of some steps of a manufacturing method of a package structure according to a first embodiment of the disclosure. FIG. 1J is a schematic partial cross-sectional view of a package structure according to the first embodiment of the disclosure. FIG. 1K is a schematic partial top view of a package structure according to the first embodiment of the disclosure.

With reference to FIG. 1A, in this embodiment, a circuit motherboard 190 may be provided. The circuit motherboard 190 may be a Si-substrate-free circuit board. For instance, an insulation material 193 in the circuit motherboard 190 may include epoxy prepreg sheet, aramid prepreg sheet, or any other similar polymer prepreg.

In this embodiment, the circuit motherboard 190 may include a plurality of circuit layers 191 and a conductive microvia 192 located among the circuit layers 191. In an embodiment, a side wall 192c of the conductive microvia 192 is substantially perpendicular to surfaces 191a of the circuit layers 191 connected to the side wall 192c.

In an embodiment, the circuit motherboard 190 may be a high density interconnect (HDI) substrate.

Figure 1B:
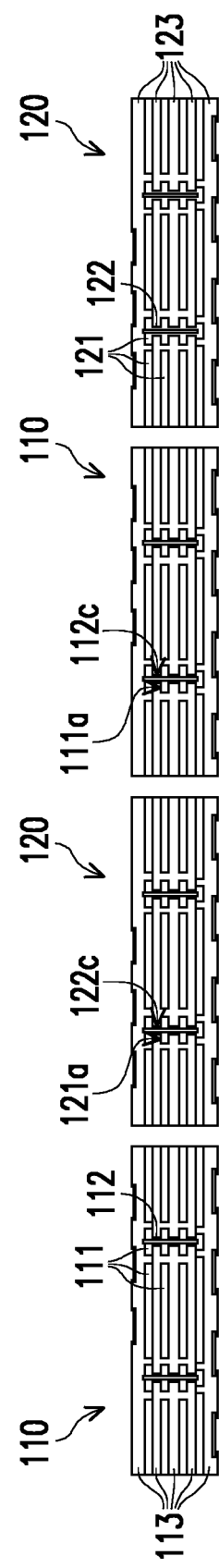

With reference to FIG. 1A to FIG. 1B, In this embodiment, a singulation process may be performed on the circuit motherboard 190 to form a plurality of first circuit boards 110 or a plurality of second circuit boards 120. In this embodiment, at least one first circuit board 110 and at least one second circuit board 120 may be formed, which should however not be construed as a limitation in the disclosure. In an embodiment, by applying the foregoing method, a singulation process may be performed on a circuit motherboard similar to the circuit motherboard 190 to form a plurality of first circuit boards 110. In an embodiment, by applying the foregoing method, a singulation process may be performed on a circuit motherboard similar to the circuit motherboard 190 to form a plurality of second circuit boards 120.

In this embodiment, the singulation process may include, for instance, a dicing process/cutting process to at least cut through the insulation material 193 of the circuit motherboard 190, which should however not be construed as a limitation in the disclosure.

Note that the foregoing methods of forming the first circuit boards 110 and/or the second circuit boards 120 are exemplary, and the first circuit boards 110 and/or the second circuit boards 120 are not limited to be formed or provided by applying the foregoing methods. In addition, other circuit boards that are the same as or similar to the first circuit boards 110 or the second circuit boards 120 may be formed or provided by applying the same or similar methods.

Figure 1C:
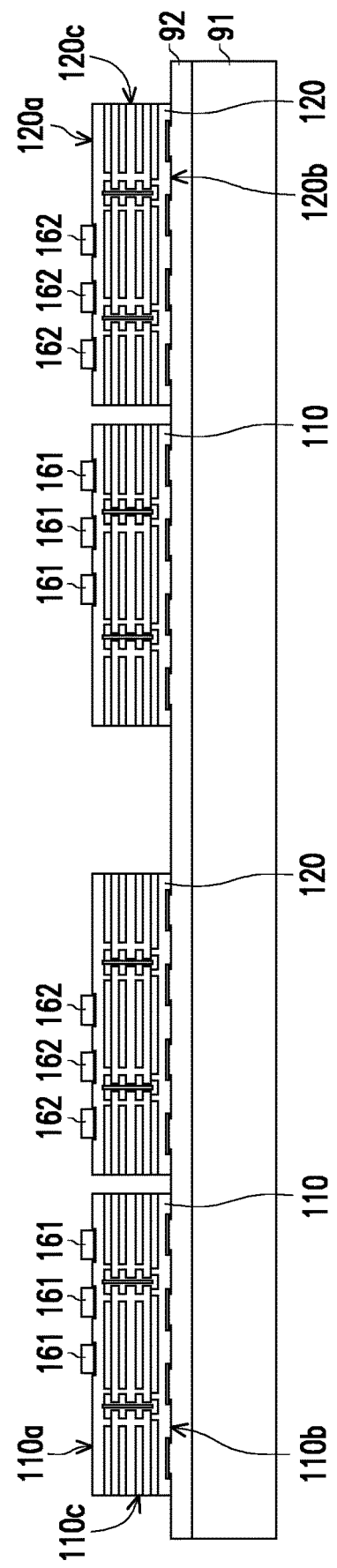

With reference to FIG. 1B and FIG. 1C, the first circuit boards 110 are provided. Each first circuit board 110 has a first top surface 110a, a first bottom surface 110b, and a first side surface 110c. The first bottom surface 110b is opposite to the first top surface 110a. The first side surface 110c is connected to the first top surface 110a and the first bottom surface 110b.

In this embodiment, the first circuit board 110 may be a Si-substrate-free circuit board. For instance, an insulation material 113 in the first circuit board 110 may include, for instance, epoxy prepreg sheet, aramid prepreg sheet, or any other similar polymer prepreg sheet.

In an embodiment, each first circuit board 110 may include a plurality of circuit layers 111 and a conductive microvia 112 located among the circuit layers 111. In an embodiment, the side wall 112c of the conductive microvia 112 is substantially perpendicular to surfaces 111a of the circuit layers 111 connected to the side wall 112c.

In an embodiment, the first circuit board 110 may be a HDI substrate.

In this embodiment, a plurality of first conductive connectors 161 may be formed on the first top surface 110a of the first circuit board 110. The first conductive connectors 161 may be electrically connected to the corresponding circuits in the first circuit board 110.

In an embodiment, the first conductive connectors 161 may include a conductive pillar, a solder ball, a conductive bump, or a conductive connector in other forms or shapes. The first conductive connectors 161 may be disposed on the first top surface 110a of the first circuit board 110 and may be formed through plating, deposition, ball placement, reflow, and/or any other appropriate process.

In an embodiment, the first conductive connectors 161 may be formed before the singulation process is performed on the circuit motherboard 190 (shown in FIG. 1A). In an embodiment, the first conductive connectors 161 may be formed after the singulation process is performed on the circuit motherboard 190 (shown in FIG. 1A).

With reference to FIG. 1B and FIG. 1C, the second circuit boards 120 are provided. Each second circuit board 120 has a second top surface 120a, a second bottom surface 120b, and a second side surface 120c. The second bottom surface 120b is opposite to the second top surface 120a. The second side surface 120c is connected to the second top surface 120a and the second bottom surface 120b.

In this embodiment, the second circuit board 120 may be a Si-substrate-free circuit board. For instance, an insulation material 123 in the second circuit board 120 may include epoxy prepreg sheet, aramid prepreg sheet, or any other similar polymer prepreg sheet.

In an embodiment, each second circuit board 120 may include a plurality of circuit layers 121 and a conductive microvia 122 located among the circuit layers 121. In an embodiment, the side wall 122c of the conductive microvia 122 is substantially perpendicular to surfaces 121a of the circuit layers 121 connected to the side wall 122c.

In an embodiment, the second circuit board 120 may be a HDI substrate.

In this embodiment, a plurality of second conductive connectors 162 may be formed on the second top surface 120a of the second circuit board 120. The second conductive connectors 162 may be electrically connected to the corresponding circuits in the second circuit board 120.

In an embodiment, the second conductive connectors 162 may include a conductive pillar, a solder ball, a conductive bump, or a conductive connector in other forms or shapes. The second conductive connectors 162 may be disposed on the second top surface 120a of the second circuit board 120 and may be formed through plating, deposition, ball placement, reflow, and/or any other appropriate process.

In an embodiment, the second conductive connectors 162 may be formed before the singulation process is performed on the circuit motherboard 190 (shown in FIG. 1A). In an embodiment, the second conductive connectors 162 may be formed after the singulation process is performed on the circuit motherboard 190 (shown in FIG. 1A).

With reference to FIG. 1C, in this embodiment, the first circuit boards 110 and/or the second circuit boards 120 may be disposed on a carrier 91. The carrier 91 may be made of glass, a wafer substrate, metal, or any other suitable material, as long as these materials may hold structures or components formed thereon in subsequent manufacturing steps.

In this embodiment, a release layer 92 may be provided on the carrier 91. The release layer 92 may be a light to heat conversion (LTHC) adhesion layer, which should however not be construed as a limitation in the disclosure.

Note that the order of arranging the first circuit boards 110 and the second circuit boards 120 is not limited in the disclosure.

In the cross-section shown in FIG. 1C, two first circuit boards 110 and two second circuit boards 120 are exemplarily depicted, while the number of the first circuit boards 110 and the number of the second circuit boards 120 on the carrier 91 are not limited in the disclosure.

In addition, in other cross-sections that are not shown in the drawings, other circuit boards may be provided. For instance, circuit boards that are the same as or similar to the first circuit boards 110 or the second circuit boards 120 (e.g., circuit boards 178 and 179 shown in FIG. 1J) may be disposed on the carrier 91.

In an embodiment, the first conductive connectors 161 may be formed before the first circuit boards 110 are disposed on the carrier 91. In an embodiment, the first conductive connectors 161 may be formed after the first circuit boards 110 are disposed on the carrier 91.

In an embodiment, the second conductive connectors 162 may be formed before the second circuit boards 120 are disposed on the carrier 91. In an embodiment, the second conductive connectors 162 may be formed after the second circuit boards 120 are disposed on the carrier 91.

In an embodiment, the first circuit boards 110 and/or the second circuit boards 120 disposed on the carrier 91 may be known good substrates (KGSs). For instance, before the first circuit boards 110 and/or the second circuit boards 120 are disposed on the carrier 91, an electrical inspection, such as an open/short (O/S) test, a visual inspection (e.g., an auto optical inspection (AOI)), or any other suitable inspection or test procedure, may be conducted on the first circuit boards 110 and/or the second circuit boards 120. Thereby, it may be determined that the first circuit boards 110 and/or the second circuit boards 120 disposed on the carrier 91 can perform good functions, and the yield of the package structure 100 (shown in FIG. 1J or FIG. 1K) may be improved.

Figure 1D:
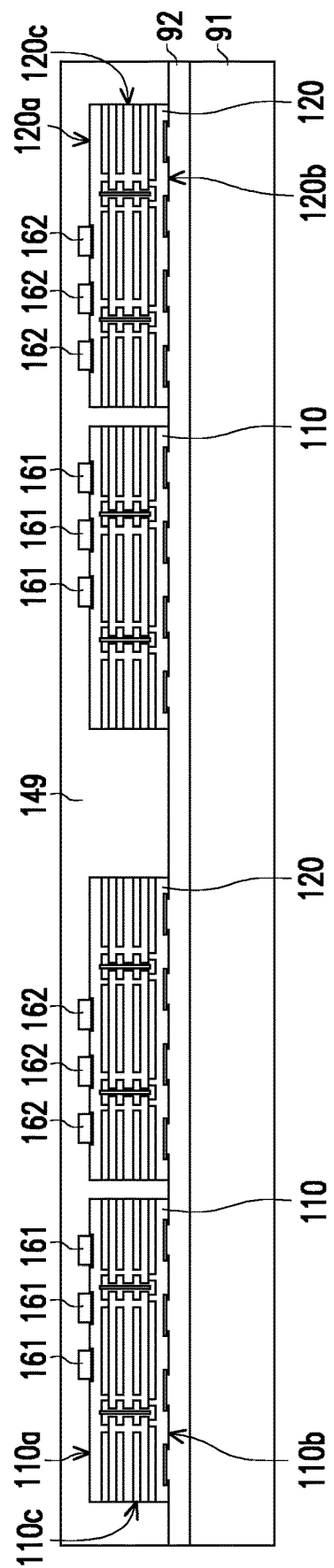
Figure 1E:
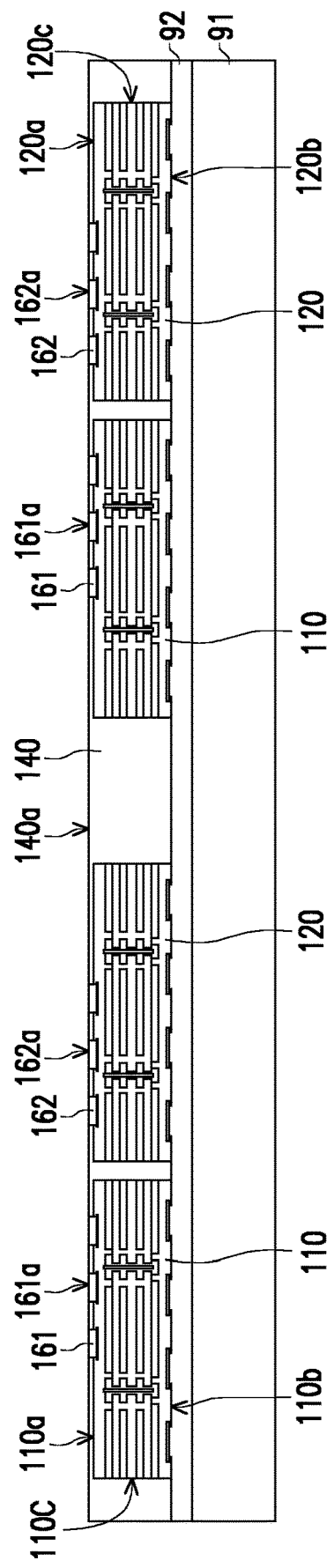

With reference to FIG. 1D to FIG. 1E, a first encapsulant 140 encapsulating the first circuit boards 110 and the second circuit boards 120 is formed on the carrier 91.

In an embodiment, steps of forming the first encapsulant 140 are exemplified below.

For instance, with reference to FIG. 1D, a molding material 149 covering the first circuit boards 110 and the second circuit boards 120 may be formed. In an embodiment, the molding material 149 is formed by forming a melted molding compound on the carrier 91 through performing a molding process or another suitable method. The melted molding compound is then cooled and cured.

In this embodiment, the molding material 149 may further cover the first conductive connectors 161 or the second conductive connectors 162, which should however not be construed as a limitation in the disclosure.

With reference to FIG. 1D to FIG. 1E, after the molding material 149 (shown in FIG. 1D) is formed, a thinning process may be performed to remove a portion of the molding material 149, so as to form the first encapsulant 140 encapsulating the first circuit boards 110 and the second circuit boards 120 in a side by side manner (shown in FIG. 1E). In this embodiment, the first encapsulant 140 may expose first conductive top surfaces 161a of the first conductive connectors 161 and second conductive top surfaces 162a of the second conductive connectors 162.

In an embodiment, the thinning process includes, for instance, chemical mechanical polishing (CMP), mechanical grinding, etching, or any other suitable manufacturing process, which should however not be construed as a limitation in the disclosure.

In an embodiment, after the thinning process is performed, the first conductive top surfaces 161a of the first conductive connectors 161, the second conductive top surfaces 162a of the second conductive connectors 162, and an encapsulating top surface 140a of the first encapsulant 140 may be substantially coplanar.

In an embodiment, in the thinning process, a portion of the first conductive connectors 161 and/or a portion of the second conductive connectors 162 may be slightly removed.

In this embodiment, the first encapsulant 140 may be in direct contact with the first side surfaces 110c of the first circuit boards 110 and/or the second side surfaces 120c of the second circuit boards 120. In this embodiment, a portion of the first encapsulant 140 may be located between the first circuit boards 110 and the second circuit boards 120.

In this embodiment, the first encapsulant 140 may be in direct contact with the first top surfaces 110a of the first circuit boards 110 and/or the second top surfaces 120a of the second circuit boards 120.

In an embodiment, owing to the first conductive connectors 161, damages to the first top surfaces 110a of the first circuit boards 110 in the step of forming the first encapsulant 140 may be reduced. Thereby, the yield of the package structure 100 (shown in FIG. 1J or FIG. 1K) may be improved.

In an embodiment, owing to the second conductive connectors 162, damages to the second top surfaces 120a of the second circuit boards 120 in the step of forming the first encapsulant 140 may be reduced. Thereby, the yield of package structure 100 (shown in FIG. 1J or FIG. 1K) may be improved.

Figure 1F:
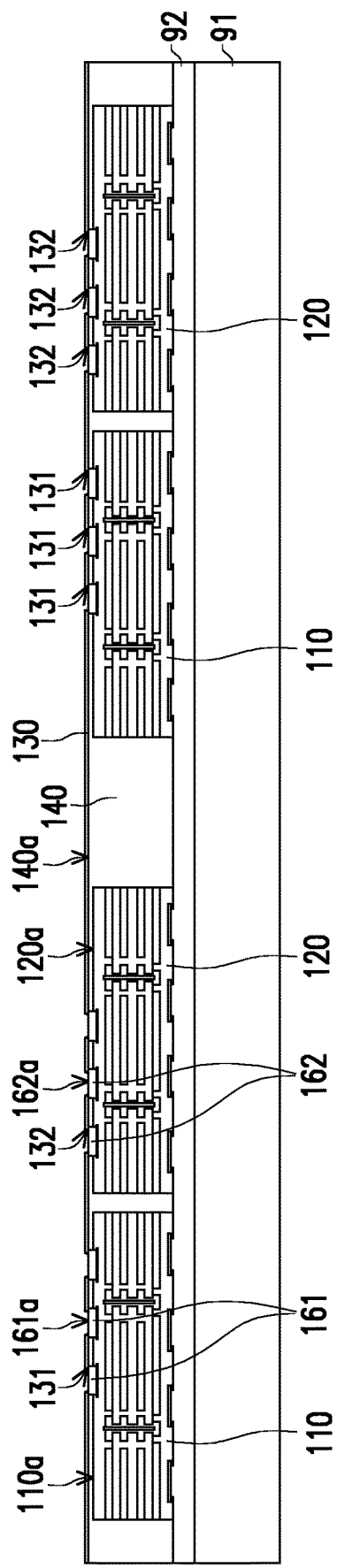

With reference to FIG. 1F, in this embodiment, an insulation layer 130 may be formed on the first top surfaces 110a of the first circuit boards 110 or the second top surfaces 120a of the second circuit boards 120. In this embodiment, the insulation layer 130 may be further located on the encapsulating top surface 140a of the first encapsulant 140.

In this embodiment, openings 131 of the insulation layer 130 may expose the first conductive top surfaces 161a of the first conductive connectors 161. For instance, the insulation layer 130 may be in direct contact with parts of the first conductive top surfaces 161a of the first conductive connectors 161, and the openings 131 of the insulation layer 130 may expose the remaining parts of the first conductive top surfaces 161a of the first conductive connectors 161.

In this embodiment, openings 132 of the insulation layer 130 may expose the second conductive top surfaces 162a of the second conductive connectors 162. For instance, the insulation layer 130 may be in direct contact with parts of the second conductive top surfaces 162a of the second conductive connectors 162, and the openings 132 of the insulation layer 130 may expose the remaining parts of the second conductive top surfaces 162a of the second conductive connectors 162.

Figure 1G:
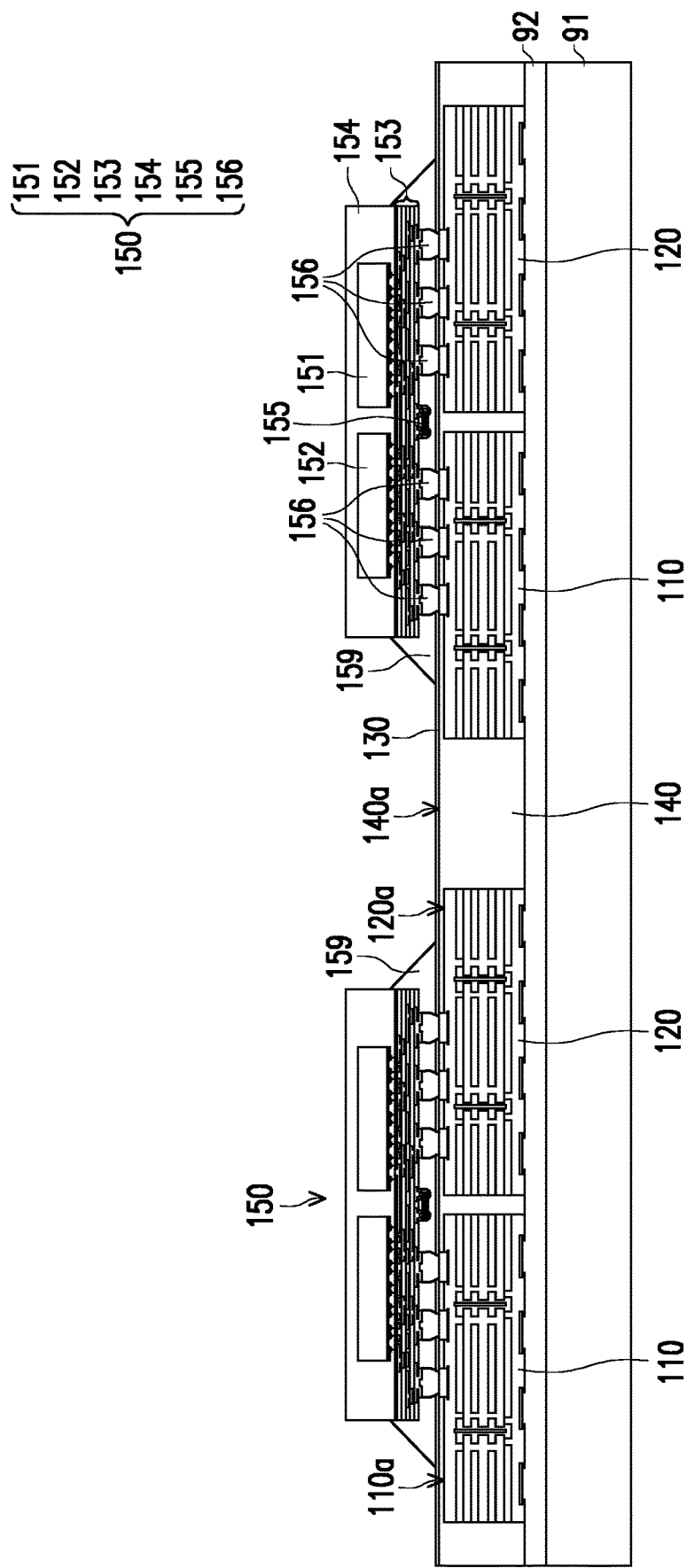

With reference to FIG. 1G, package devices 150 are disposed on the first top surfaces 110a of first circuit boards 110 or the second top surfaces 120a of the second circuit boards 120, and the package devices 150 are electrically connected to the corresponding circuits in the first circuit boards 110 and the corresponding circuits in the second circuit boards 120.

Each package device 150 includes a first chip 151, a second chip 152, a chip encapsulant 154, a circuit layer 153, and a plurality of conductive package terminals 156. The chip encapsulant 154 encapsulates the first chip 151 and the second chip 152. The circuit layer 153 is located on the chip encapsulant 154. The first chip 151 is electrically connected to the corresponding circuit in the circuit layer 153. The second chip 152 is electrically connected to the corresponding circuit in the circuit layer 153. The conductive package terminals 156 are located on the circuit layer 153 and electrically connected to the corresponding circuit in the circuit layer 153. The first chip 151 may be electrically connected to the corresponding circuits in the first circuit boards 110 and/or the corresponding circuits in the second circuit boards 120 through the corresponding circuit in the circuit layer 153 and the corresponding conductive package terminals 156. The second chip 152 may be electrically connected to the corresponding circuits in the first circuit boards 110 and/or the corresponding circuits in the second circuit boards 120 through the corresponding circuit in the circuit layer 153 and the corresponding conductive package terminals 156.

In this embodiment, each package device 150 may further include an electronic device 155. The electronic device 155 may be disposed on the circuit layer 153 and on a side opposite to the first chip 151 and the second chip 152. The electronic device 155 may be electrically connected to the corresponding circuit in the circuit layer 153. In an embodiment, the electronic device 155 may be a passive device, which should however not be construed as a limitation in the disclosure.

In an embodiment, the first chip 151 or the second chip 152 may be a power management integrated circuit (PMIC) chip, a micro-electro-mechanical-system (MEMS) chip, an application-specific integrated circuit (ASIC) chip, a dynamic random access memory (DRAM) chip, a static random access memory (SRAM) chip, a high-frequency memory chip, a system on chip (SoC), or any other similar high-performance computing chip, which should however not be construed as a limitation in the disclosure.

In an embodiment, the first chip 151 and the second chip 152 may be homogeneous chips or heterogeneous chips, which should however not be construed as a limitation in the disclosure.

In an embodiment, the package devices 150 may be fan-out package devices, wafer level chip scale package (WLCSP) devices, flip-chip chip-scale package (FCCSP) devices, window BGA (wBGA) package devices, or any other suitable package devices, which should however not be construed as a limitation in the disclosure.

In an embodiment, the package devices 150 disposed on the first circuit boards 110 or the second circuit boards 120 may be known good packages (KGPs). For instance, before the package devices 150 are disposed on the first circuit boards 110 or the second circuit boards 120, an electrical inspection, such as a 0/S test, a visual inspection (e.g., AOI), or any other suitable inspection or test procedure, may be conducted on the package devices 150. Thereby, it may be determined that the package devices 150 on the first circuit boards 110 or the second circuit boards 120 disposed on the carrier 91 can perform good functions, and the yield of the package structure 100 (shown in FIG. 1J or FIG. 1K) may be improved.

In this embodiment, a filler layer 159 may be formed between the package devices 150 and the first circuit boards 110/the second circuit boards 120, which should however not be construed as a limitation in the disclosure. The filler layer 159 is, for instance, a capillary underfill or any other suitable filler material, which should however not be construed as a limitation in the disclosure.

In FIG. 1G, note that two package devices 150 are exemplarily shown, while the number of the package devices 150 disposed on the first circuit boards 110 or the second circuit boards 120 should not be construed as a limitation in the disclosure.

Figure 1H:
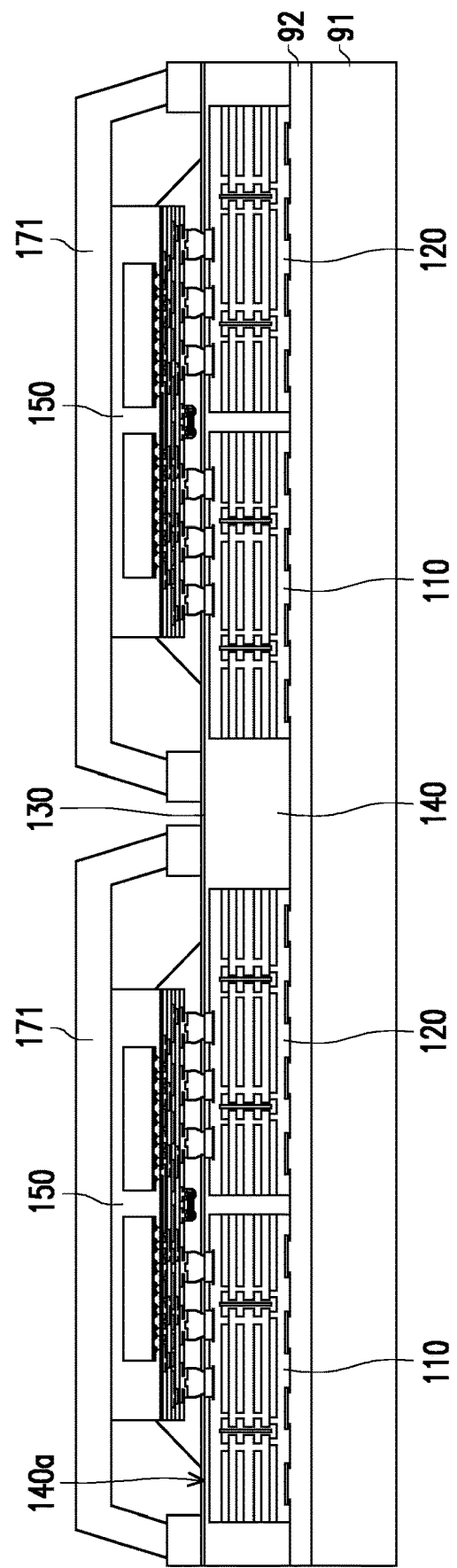

With reference to FIG. 1H, in this embodiment, casings 171 may be disposed on the encapsulating top surface 140a of the first encapsulant 140.

In this embodiment, the casings 171 may be located on the insulation layer 130. In an embodiment, an adhesive material may be provided between the casings 171 and the insulation layer 130, and the casings 171 may be adhered to the insulation layer 130.

Figure 1I:
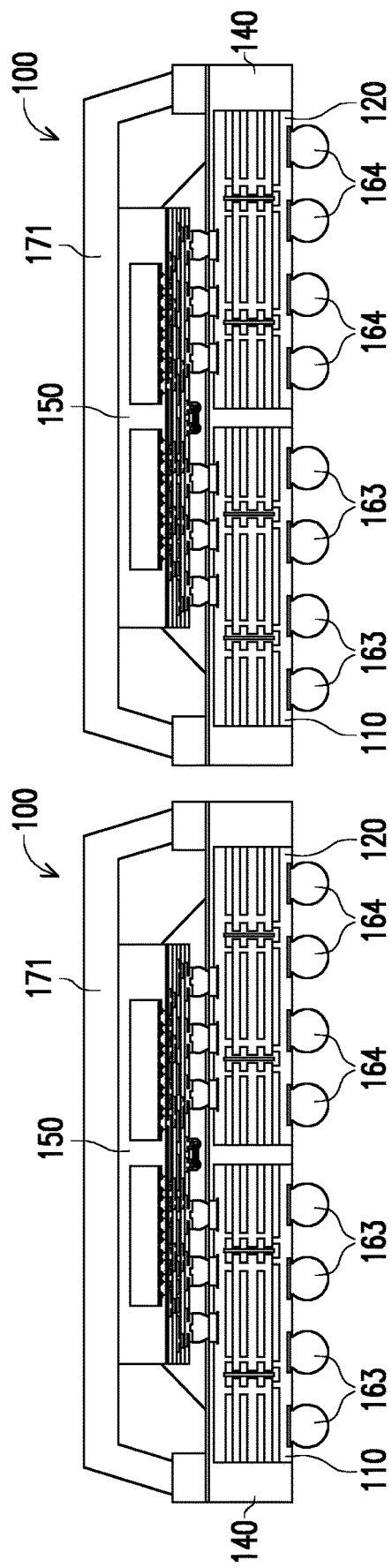
Figure 1J:
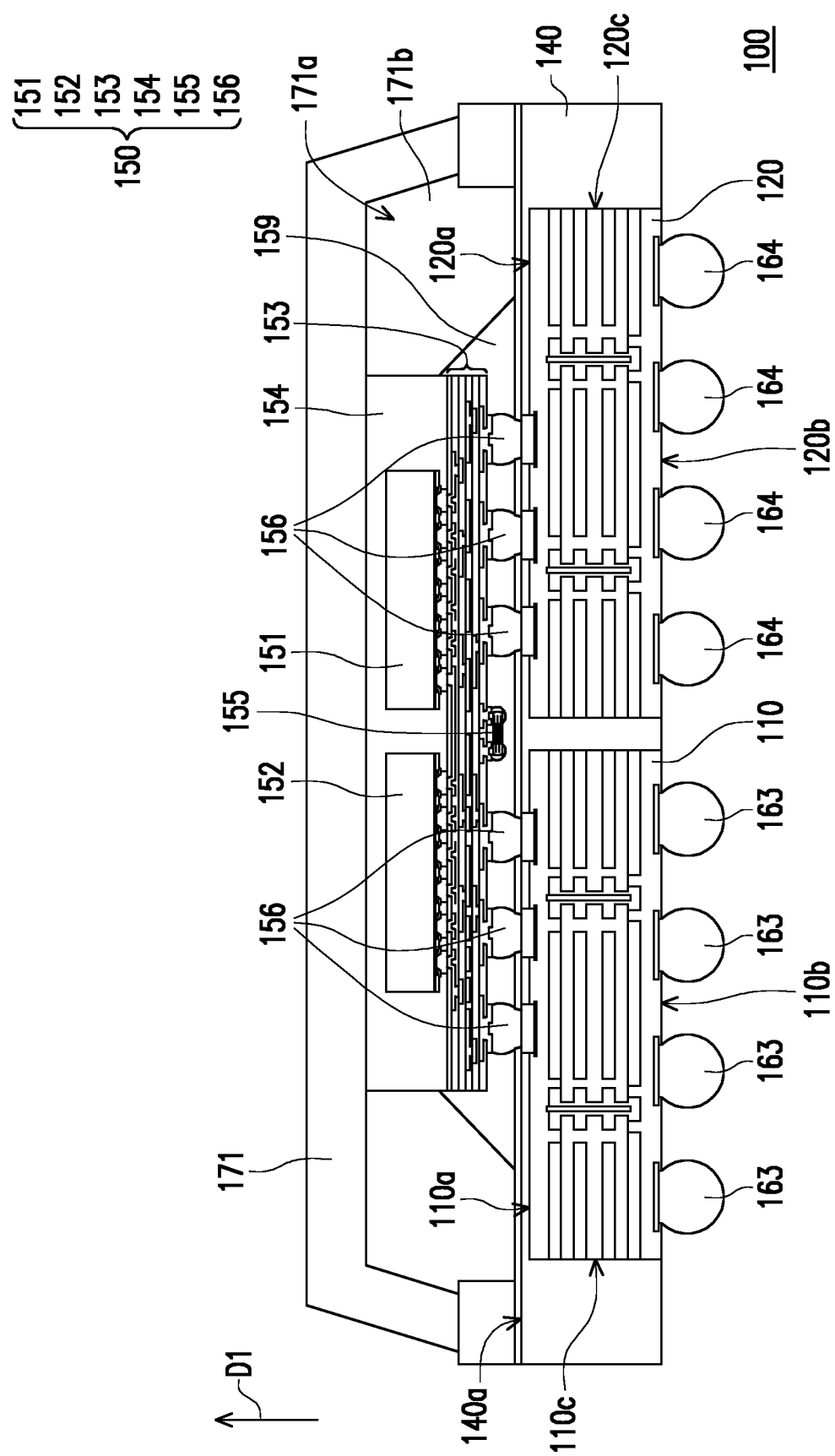
FIG. 1J is a schematic partial cross-sectional view of a package structure according to the first embodiment of the disclosure.
Figure 1K:
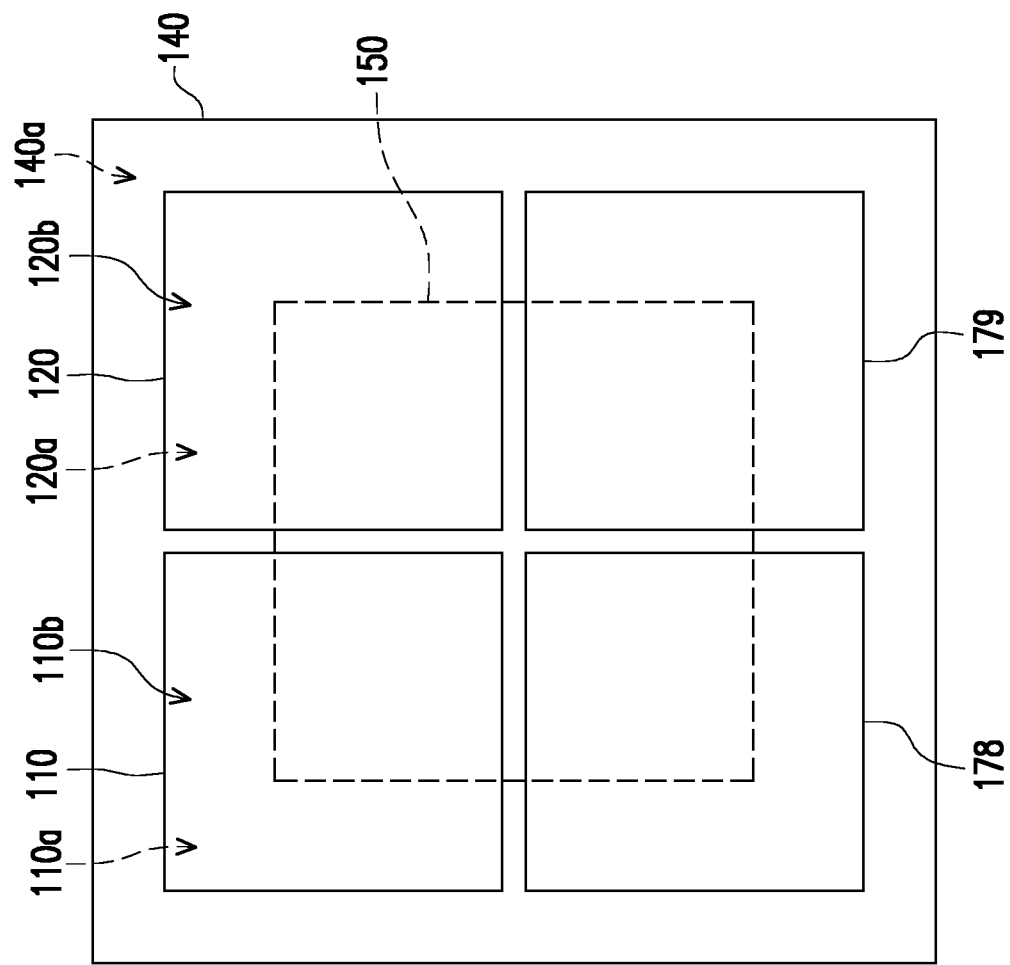
FIG. 1K is a schematic partial top view of a package structure according to the first embodiment of the disclosure.

With reference to FIG. 1H to FIG. 1I, the carrier 91 (shown in FIG. 1H) may be removed to expose the first bottom surfaces 110b of the first circuit boards 110 and the second bottom surfaces 120b of the second circuit boards 120.

With reference to FIG. 1I, first conductive terminals 163 are disposed on the first bottom surfaces 110b of the first circuit boards 110, and the first conductive terminals 163 are electrically connected to the corresponding circuits in the first circuit boards 110.

With reference to FIG. 1I, second conductive terminals 164 are disposed on the second bottom surfaces 120b of the second circuit boards 120, and the second conductive terminals 164 are electrically connected to the corresponding circuits in the second circuit boards 120.

In this embodiment, the first conductive terminals 163 or the second conductive terminals 164 may include solder balls or conductive terminals in other forms or shapes. The first conductive terminals 163 or the second conductive terminals 164 may be formed through ball placement, reflow, and/or any other suitable manufacturing process.

Note that the order of the step of arranging the first conductive terminals 163 and the step of arranging the second conductive terminals 164 should not be construed as a limitation in the disclosure.

With reference to FIG. 1H to FIG. 1I, in this embodiment, a plurality of package structures 100 may be formed by performing a singulation process. The singulation process may include, for instance, a dicing process/cutting process to at least cut through the first encapsulant 140.

After the singulation process is performed, note that similar component symbols serve to denote the singulated devices. For instance, the first circuit boards 110 shown in FIG. 1H may be the first circuit boards 110 shown in FIG. 1I after singulation, the second circuit boards 120 shown in FIG. 1H may be the second circuit boards 120 shown in FIG. 1I after singulation, the first encapsulant 140 shown in FIG. 1H may be the first encapsulants 140 shown in FIG. 1I after singulation, the first conductive terminals 163 shown in FIG. 1H may be the first conductive terminals 163 shown in FIG. 1I after singulation, the second conductive terminals 164 shown in FIG. 1H may be the second conductive terminals 164 shown in FIG. 1I after singulation, the package devices 150 shown in FIG. 1H may be the package devices 150 shown in FIG. 1I after singulation, and so on. Other singulated devices will follow the same symbol rules of denoting the devices as provided above, and thus no further description or illustration will be provided hereinafter.

Note that the order of the step of disposing the casings 171 and the step of performing the singulation process should not be construed as limitations in the disclosure.

After the aforesaid steps are completely performed, the package structure 100 provided in this embodiment may be substantially formed.

With reference to FIG. 1F and FIG. 1G, the package structure 100 includes the first circuit board 110, the second circuit board 120, the first encapsulant 140, the conductive terminals 163 and 164, and the package device 150. The first circuit board 110 has the first top surface 110a and the first bottom surface 110b opposite to the first top surface 110a. The second circuit board 120 has the second top surface 120a and the second bottom surface 120b opposite to the second top surface 120a. The first encapsulant 140 encapsulates the first circuit board 110 and the second circuit board 120. The conductive terminals 163 and 164 may include the first conductive terminals 163 or the second conductive terminals 164. The first conductive terminals 163 are disposed on the first bottom surface 110b of the first circuit board 110. The first conductive terminals 163 are electrically connected to the corresponding circuits in the first circuit board 110. The second conductive terminals 164 are disposed on the second bottom surface 120b of the second circuit board 120. The second conductive terminals 164 are electrically connected to the corresponding circuits in the second circuit board 120. The package device 150 includes the first chip 151, the second chip 152, the chip encapsulant 154, the circuit layer 153, and the conductive package terminals 156. The package device 150 is disposed on the first top surface 110a of the first circuit board 110 or the second top surface 120a of the second circuit board 120. The package device 150 is electrically connected to the corresponding circuit in the first circuit board 110 and the corresponding circuit in the second circuit board 120.

In this embodiment, at least two of the first top surface 110a of the first circuit board 110, the first bottom surface 110b of the first circuit board 110, the second top surface 120a of the second circuit board 120, and the second bottom surface 120b of the second circuit board 120 are substantially parallel, which should however not be construed as a limitation in the disclosure.

In this embodiment, in a projection direction D1 perpendicular to the first top surface 110a of the first circuit board 110 or the second top surface 120a of the second circuit board 120, the first circuit board 110 and the second circuit board 120 do not overlap. In an embodiment, the first circuit board 110 and the second circuit board 120 may be arranged in a side by side manner.

In this embodiment, in the projection direction D1 perpendicular to the first top surface 110a of the first circuit board 110 or the second top surface 120a of the second circuit board 120, the first circuit board 110 and the second circuit board 120 overlap the package device 150. In an embodiment, in the projection direction D1, the first circuit board 110 partially overlaps the package device 150, and the second circuit board 120 partially overlaps the package device 150.

In this embodiment, a portion of the first encapsulant 140 may be located between the first circuit board 110 and the package device 150.

In this embodiment, the package structure 100 may further include the first conductive connectors 161. The first conductive connectors 161 may be disposed on the first top surface 110a of the first circuit board 110. The package device 150 may be electrically connected to the corresponding circuits in the first circuit board 110 through the corresponding first conductive connectors 161. The first conductive connectors 161 may be embedded in the portion of the first encapsulant 140 between the first circuit board 110 and the package device 150. That is to say, the portion of the first encapsulant 140 located between the first circuit board 110 and the package device 150 may encapsulate the first conductive connectors 161 in a side by side manner.

In this embodiment, a portion of the first encapsulant 140 may be located between the second circuit board 120 and the package device 150.

In this embodiment, the package structure 100 may further include the second conductive connectors 162. The second conductive connectors 162 may be disposed on the second top surface 120a of the second circuit board 120. The package device 150 may be electrically connected to the corresponding circuits in the second circuit board 120 through the corresponding second conductive connectors 162. The second conductive connectors 162 may be embedded in the portion of the first encapsulant 140 between the second circuit board 120 and the package device 150. That is to say, the portion of the first encapsulant 140 located between the second circuit board 120 and the package device 150 may encapsulate the second conductive connectors 162 in a side by side manner.

In this embodiment, the package structure 100 may further include the insulation layer 130.

In this embodiment, the insulation layer 130 may be located on the first top surface 110a of the first circuit board 110. The corresponding conductive package terminals 156 in the package device 150 may be embedded in the insulation layer 130, so that the corresponding conductive package terminals 156 in the package device 150 may be electrically connected to the corresponding circuits in the first circuit board 110 through the corresponding first conductive connectors 161.

In an embodiment, two opposite ends of the first conductive connectors 161 may be in direct contact with the conductive package terminals 156 of the package device 150 and the corresponding circuits in the first circuit board 110.

In an embodiment, a signal transmission distance between the package device 150 and the first circuit board 110 is substantially the same as the physical distance between the package device 150 and the first circuit board 110. For instance, the signal between the package device 150 and the first circuit board 110 may be transmitted through the corresponding conductive member (e.g., the corresponding first conductive connector 161), and the distance between the package device 150 and the first circuit board 110 is substantially equal to the height or the thickness of the aforesaid conductive member (e.g., the height of the corresponding first conductive connector 161). Thereby, the quality and efficiency of signal transmission between the package device 150 and the first circuit board 110 may be improved.

In this embodiment, the insulation layer 130 may be located on the second top surface 120a of the second circuit board 120. The corresponding conductive package terminals 156 in the package device 150 may be embedded in the insulation layer 130, so that the corresponding conductive package terminals 156 in the package device 150 may be electrically connected to the corresponding circuits in the second circuit board 120 through the corresponding second conductive connectors 162.

In an embodiment, two opposite ends of the second conductive connectors 162 may be in direct contact with the conductive package terminals 156 of the package device 150 and the corresponding circuits in the second circuit board 120.

In an embodiment, a signal transmission distance between the package device 150 and the second circuit board 120 is substantially the same as the physical distance between the package device 150 and the second circuit board 120. For instance, the signal between the package device 150 and the second circuit board 120 may be transmitted through the corresponding conductive member (e.g., the corresponding second conductive connector 162), and the distance between the package device 150 and the second circuit board 120 is substantially equal to the height or the thickness of the aforesaid conductive member (e.g., the height of the corresponding second conductive connector 162). Thereby, the quality and efficiency of signal transmission between the package device 150 and the second circuit board 120 may be improved.

In an embodiment, there may be no redistribution circuit between the package device 150 and the first circuit board 110 and between the package device 150 and the second circuit board 120. Besides, in the manufacturing process of the package structure 100, the package device 150 is connected between the first circuit board 110 and the second circuit board 120, so as to determine the package device 150 as a KGP and determine the first circuit board 110 and the second circuit board 120 as KGSs by conducting an appropriate inspection or test procedures. Thereby, the yield of the package structure 100 may be improved during the manufacturing process.

In this embodiment, the first encapsulant 140 may not be in direct contact with the package device 150, which should however not be construed as a limitation in the disclosure. For instance, the first encapsulant 140 and the package device 150 may be separated from each other by the insulation layer 130.

In this embodiment, the package structure 100 may further include the casing 171. The casing 171 is disposed on the encapsulating top surface 140a of the first encapsulant 140. The casing 171 has an accommodation space 171a, and the package device 150 is located in the accommodation space 171a.

In an embodiment, the casing 171 may include a rigid material. Thereby, the casing 171 may serve to protect devices (e.g., the package device 150) inside the casing 171.

In an embodiment, the casing 171 may include a conductive material. In an alternative embodiment, the conductive casing 171 may serve as an electromagnetic interference (EMI) shielding and may reduce electromagnetic interference, which should however not be construed as a limitation in the disclosure. In an alternative embodiment, the conductive portion of the casing 171 may serve as an antenna, which should however not be construed as a limitation in the disclosure.

In an embodiment, the casing 171 may include a thermally conductive material. The thermally conductive casing 171 may be thermally coupled to the package device 150.

In this embodiment, an air gap 171b may exist between the casing 171 and the package device 150.

In this embodiment, in the package structure 100 which has the package device 150 including a plurality of chips (e.g., the first chip 151 and the second chip 152), power or signal transmission among the chips (e.g., the first chip 151 and the second chip 152) should be performed through the corresponding circuits (e.g., the circuit layer 153 in the package device 150), and each chip (e.g., the first chip 151 and the second chip 152) is required to transmit power or signal to the outside through the corresponding circuit (e.g., through the corresponding circuit board and external electronic devices connected to the conductive terminals). Therefore, by means of the circuit boards (e.g., the first circuit board 110 and the second circuit board 120), the manufacturing method of the package structure 100 may be relatively simple, and/or the manufacturing costs may be relatively low. In addition, the overall circuit layout of the package structure 100 may reduce the load of the circuit layer 153 of the package device 150 (e.g., the number of conductive layers of the circuit layer 153 may be reduced, the line/space (L/S) and/or the circuit layout of the conductive layers of the circuit layer 153 may be easily optimized, and so on). Thereby, the quality of the package structure 100 may be improved. For instance, the overall layout, the cost, and/or the manufacturing process may be optimized by the number of conductive layers of the circuit boards 110 and 120 and the package device 150. If the yield may be reduced because of the excessive number of the conductive layers of the circuit boards 110 and 120, the number of conductive layers of the circuit boards 110 and 120 may be reduced by adjusting the fine pitch on the circuit layer 153 of the package device 150 or the L/S. Alternatively, if the costs may be increased or the issue of warpage arises because of the excessive number of the circuit layer 153 of the package device 150, some circuits may be arranged to be in the circuit boards 110 and 120 through the circuit layout.

Figure 2:
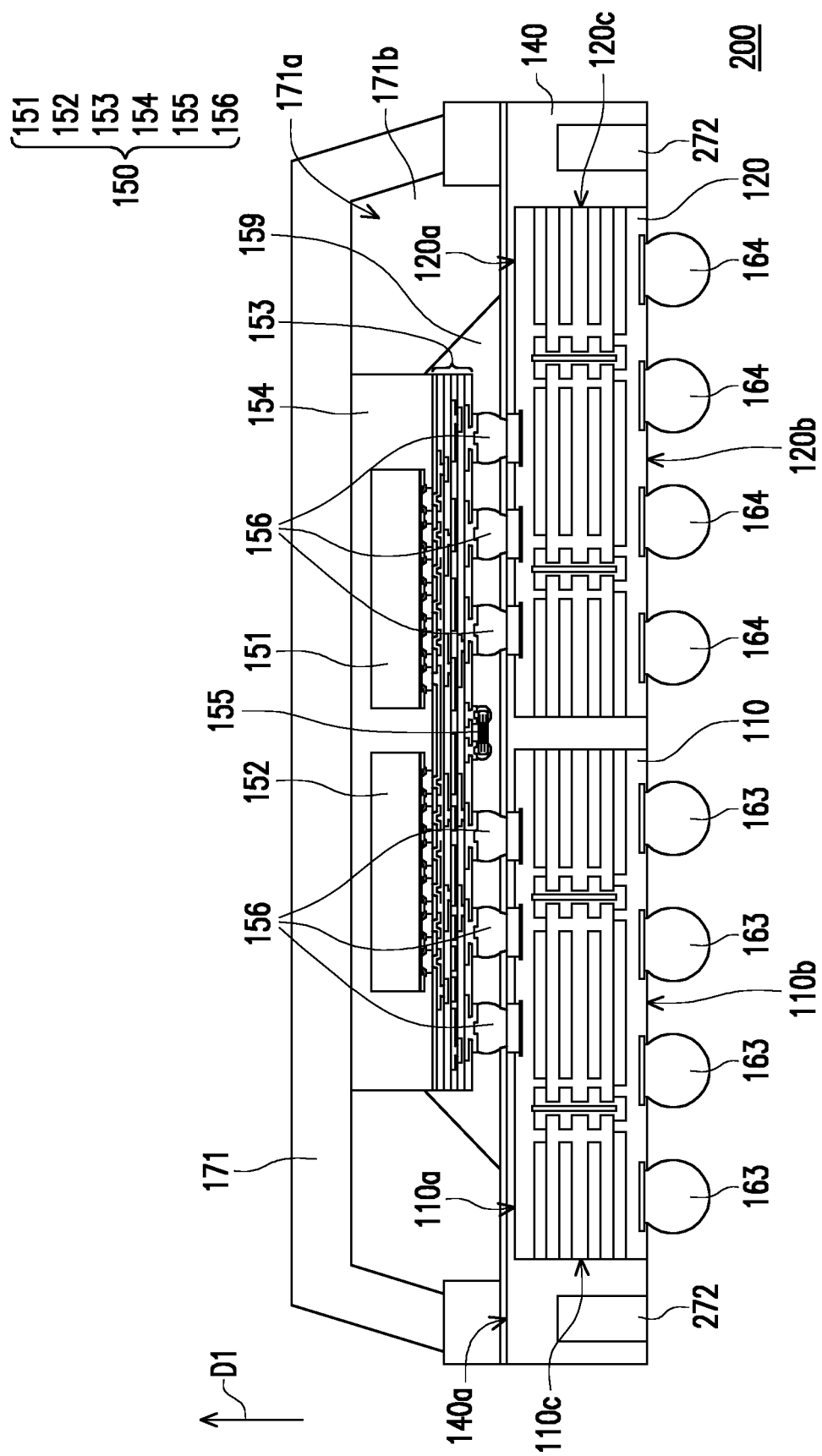
FIG. 2 is a schematic partial cross-sectional view of a package structure according to a second embodiment of the disclosure.

FIG. 2 is a schematic partial cross-sectional view of a package structure according to a second embodiment of the disclosure. A manufacturing method of a package structure 200 provided in the second embodiment is similar to the manufacturing method of the package structure 100 provided in the first embodiment, and similar components are represented by the same reference numbers and have similar functions, materials, or formation methods; hence, the descriptions of the similar components are omitted hereinafter.

With reference to FIG. 2, in this embodiment, the package structure 200 includes the first circuit board 110, the second circuit board 120, the first encapsulant 140, the conductive terminals 163 and 164, the package device 150, and a stiffening support member 272. The stiffening support member 272 may be embedded in the first encapsulant 140. In other words, the first encapsulant 140 may encapsulate a portion of the stiffening support member 272.

In an embodiment, the stiffening support member 272 may include a supporting die. For instance, an ugly die, a failed die, or any other similar dummy die may serve as the supporting die. As such, the manufacturing cost may be reduced.

In an embodiment, the stiffening support member 272 may include a rigid support ring. For instance, the stiffening support member 272 may include a ring-shaped metal strip.

In an embodiment, the stiffening support member 272 may reduce structural warpage.

Figure 3:
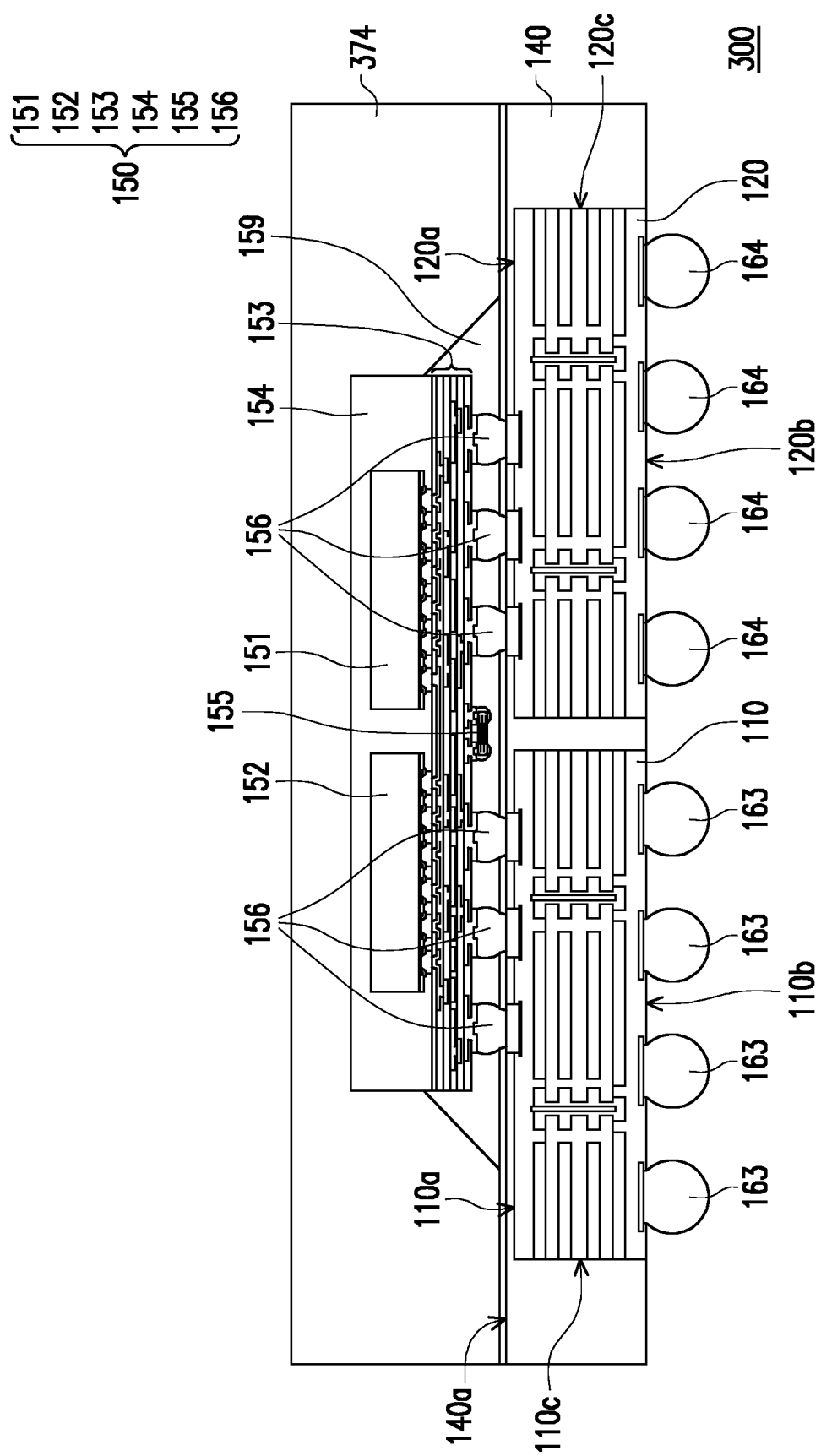
FIG. 3 is a schematic partial cross-sectional view of a package structure according to a third embodiment of the disclosure.

FIG. 3 is a schematic partial cross-sectional view of a package structure according to a third embodiment of the disclosure. A manufacturing method of a package structure 300 provided in the third embodiment is similar to the manufacturing method of the package structure 100 provided in the first embodiment, and similar components are represented by the same reference numbers and have similar functions, materials, or formation methods; hence, the descriptions of the similar components are omitted hereinafter.

With reference to FIG. 3, in this embodiment, the package structure 300 includes the first circuit board 110, the second circuit board 120, the first encapsulant 140, the conductive terminals 163 and 164, the package device 150, and a second encapsulant 374. The second encapsulant 374 may be located on the encapsulating top surface 140a of the first encapsulant 140, and the second encapsulant 374 may encapsulate the package device 150.

A material or a forming method of the second encapsulant 374 may be the same as or similar to those of the first encapsulant 140 and thus will not be repeated hereinafter.

In this embodiment, the second encapsulant 374 may not be in direct contact with the first encapsulant 140, which should however not be construed as a limitation in the disclosure. For instance, the first encapsulant 140 and the second encapsulant 374 may be separated from each other by the insulation layer 130.

Figure 4:
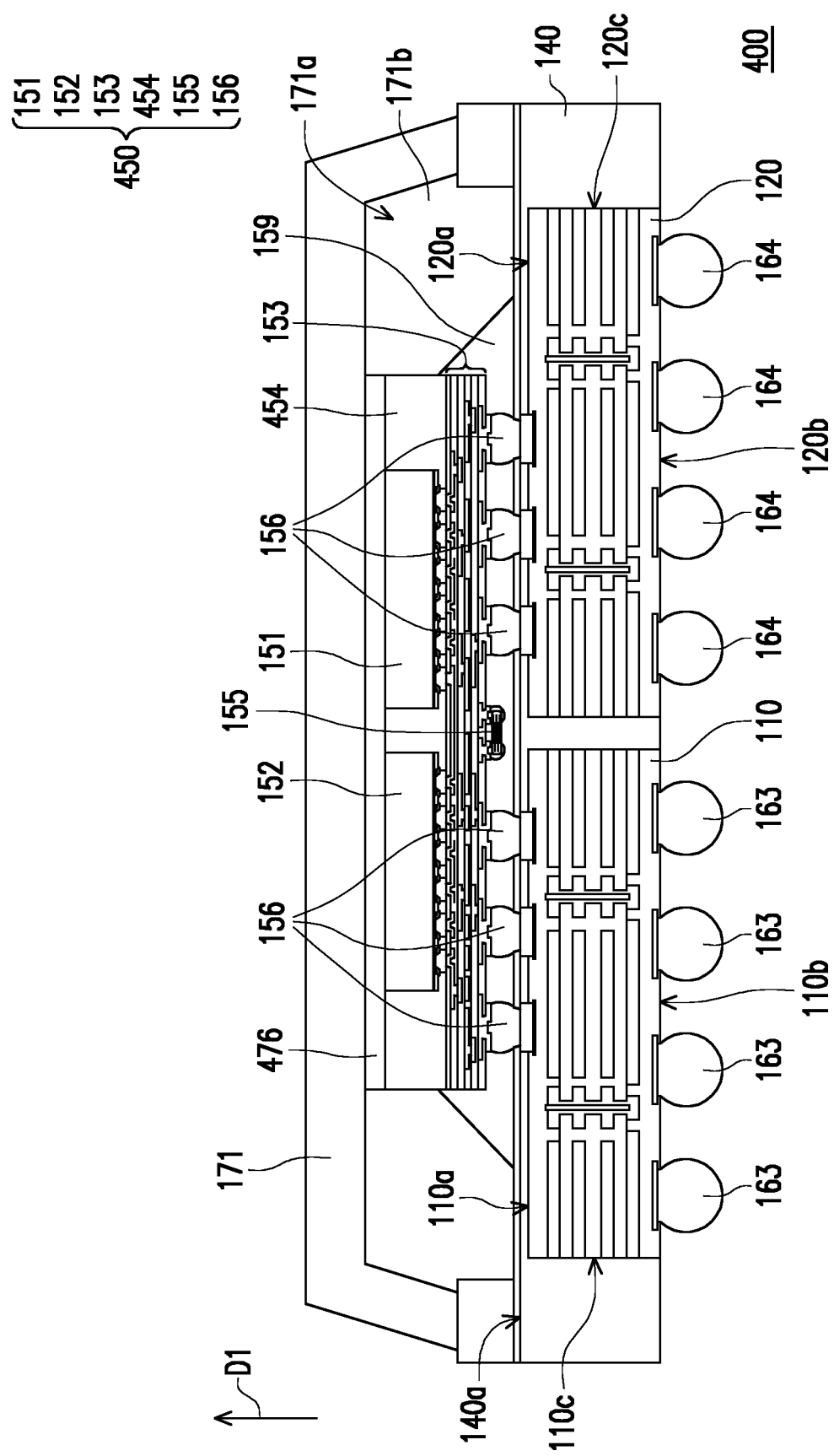
FIG. 4 is a schematic partial cross-sectional view of a package structure according to a fourth embodiment of the disclosure.

FIG. 4 is a schematic partial cross-sectional view of a package structure according to a fourth embodiment of the disclosure. A manufacturing method of a package structure 400 provided in the fourth embodiment is similar to the manufacturing method of the package structure 100 provided in the first embodiment, and similar components are represented by the same reference numbers and have similar functions, materials, or formation methods; hence, the descriptions of the similar components are omitted hereinafter.

With reference to FIG. 4, in this embodiment, the package structure 400 includes the first circuit board 110, the second circuit board 120, the first encapsulant 140, the conductive terminals 163 and 164, and a package device 450. The package device 450 includes the first chip 151, the second chip 152, a chip encapsulant 454, the circuit layer 153, and the conductive package terminals 156. The chip encapsulant 454 may expose a portion of the first chip 151 and/or a portion of the second chip 152. For instance, the chip encapsulant 454 may expose a portion of a back surface of the first chip 151 and/or a back surface of the second chip 152.

In this embodiment, there may be a thermal interface material (TIM) 476 between the casing 171 and the package device 450. The TIM 476 may be thermally coupled to the casing 171 and the package device 450. For instance, the TIM 476 may be thermally coupled to the first chip 151 and/or the second chip 152 in the package device 450 and the casing 171. As such, when the first chip 151 and/or the second chip 152 are in operation, the heat generated during the operation may be easily dissipated to the casing 171 through the TIM 476.

To sum up, according to one or more embodiments of the disclosure, in the package structure which has the package device including the chips (e.g., the first chip and the second chip), power or signal transmission among the chips (e.g., the first chip and the second chip) should be performed through the corresponding circuits (e.g., the circuit layer in the package device), and each chip (e.g., the first chip and the second chip) is required to transmit power or signal to the outside through the corresponding circuit (e.g., through the corresponding circuit board and external electronic devices connected to the conductive terminals). Therefore, by means of the circuit boards (e.g., the first circuit board and the second circuit board), the manufacturing method of the package structure may be relatively simple, and/or the manufacturing costs may be relatively low. In addition, the overall circuit layout of the package structure may reduce the load of the circuit layer of the package device (e.g., the number of conductive layers of the circuit layer may be reduced, the L/S and/or the circuit layout of the conductive layers of the circuit layer may be easily optimized, and so on). Thereby, the quality of the package structure may be improved.

Although the disclosure has been disclosed in the above embodiments, the embodiments are not intended to limit the disclosure. It will be apparent to persons skilled in the art that various modifications and variations can be made to the disclosed embodiments without departing from the scope or spirit of the disclosure. In view of the foregoing, it is intended that the disclosure cover modifications and variations provided that they fall within the scope of the following claims and their equivalents.

What is claimed is:

1. A package structure, comprising:
   a first circuit board, having a first top surface and a first bottom surface opposite to the first top surface;
   a second circuit board, having a second top surface and a second bottom surface opposite to the second top surface;
   a first encapsulant, encapsulating the first circuit board and the second circuit board;
   a plurality of conductive terminals, disposed on the first bottom surface or the second bottom surface and electrically connected to the first circuit board or the second circuit board; and
   a package device, disposed on the first top surface or the second top surface and electrically connected to the first circuit board and the second circuit board, the package device comprising:
   a first chip;
   a second chip;
   a chip encapsulant, encapsulating the first chip and the second chip;
   a circuit layer, located on the chip encapsulant and electrically connected to the first chip and the second chip; and
   a plurality of conductive package terminals, located on the circuit layer and electrically connected to the first circuit board or the second circuit board,
   wherein the first circuit board and the second circuit board do not overlap in a projection direction perpendicular to the first top surface or the second top surface.

2. The package structure according to claim 1, wherein the first circuit board and the second circuit board are Si-substrate-free circuit boards.

3. The package structure according to claim 1, wherein in the projection direction the first circuit board and the second circuit board overlap the package device.

4. The package structure according to claim 1, wherein a portion of the first encapsulant is located between the first circuit board and the package device or located between the second circuit board and the package device.

5. The package structure according to claim 4, further comprising:

a plurality of conductive connectors, disposed on the first top surface or the second top surface and embedded in the portion of the first encapsulant, the package device being electrically connected to the first circuit board or the second circuit board through the corresponding conductive connectors.

6. The package structure according to claim 1, wherein the first encapsulant is not in direct contact with the package device.

7. The package structure according to claim 1, further comprising:
   an insulation layer, located on the first top surface or the second top surface, the conductive package terminals of the package device being embedded in the insulation layer.

8. The package structure according to claim 7, further comprising:
   a plurality of conductive connectors, disposed on the first top surface or the second top surface, the insulation layer being further located on the conductive connectors and exposing a portion of each of the conductive connectors, the package device being electrically connected to the first circuit board or the second circuit board through the corresponding conductive connectors.

9. The package structure according to claim 1, further comprising:
   a casing, disposed on the first encapsulant and having an accommodation space, wherein the package device is located in the accommodation space.

10. The package structure according to claim 9, wherein an air gap exists between the casing and the package device.

11. The package structure according to claim 1, further comprising:
    a stiffening support member, embedded in the first encapsulant.

12. The package structure according to claim 1, further comprising:
    a second encapsulant, located on the first encapsulant and encapsulating the package device.

13. The package structure according to claim 12, wherein the second encapsulant is not in direct contact with the first encapsulant.

14. A manufacturing method of a package structure, comprising:
    providing a first circuit board having a first top surface and a first bottom surface opposite to the first top surface;
    providing a second circuit board having a second top surface and a second bottom surface opposite to the second top surface;
    forming a first encapsulant encapsulating the first circuit board and the second circuit board, wherein the first circuit board and the second circuit board do not overlap in a projection direction perpendicular to the first top surface or the second top surface;
    disposing a package device on the first top surface or the second top surface, wherein the package device is electrically connected to the first circuit board and the second circuit board, and the package device comprises:
      a first chip;
      a second chip;
      a chip encapsulant, encapsulating the first chip and the second chip;
      a circuit layer, located on the chip encapsulant and electrically connected to the first chip and the second chip; and
      a plurality of conductive package terminals, located on the circuit layer and electrically connected to the first circuit board or the second circuit board; and
    forming a plurality of conductive terminals on the first bottom surface or the second bottom surface, wherein the conductive terminals are electrically connected to the first circuit board or the second circuit board.

15. The manufacturing method according to claim 14, wherein the step of providing the first circuit board or the step of providing the second circuit board comprises:
    providing a circuit motherboard;
    performing a singulation process on the circuit motherboard to form a plurality of the first circuit boards or a plurality of the second circuit boards.

16. The manufacturing method according to claim 14, further comprising:
    forming a plurality of conductive connectors on the first top surface or the second top surface, where the step of forming the first encapsulant comprises:
      forming a molding material covering the first circuit board, the second circuit board, and the conductive connectors; and
      removing a portion of the molding material to form the first encapsulant, the first encapsulant exposing the conductive connectors.

* * * * *